(12) United States Patent
Kardynal et al.

(10) Patent No.: US 8,772,700 B2
(45) Date of Patent: Jul. 8, 2014

(54) PHOTON DETECTION SYSTEM AND METHOD OF PHOTON DETECTION FOR DETERMINING THE NUMBER OF PHOTONS RECEIVED AT A PHOTON DETECTOR

(75) Inventors: Beata Ewa Kardynal, Cambridgeshire (GB); Zhiliang Yuan, Cambridgeshire (GB); Andrew James Shields, Cambridgeshire (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 12/829,446

(22) Filed: Jul. 2, 2010

(65) Prior Publication Data
US 2010/0294919 A1    Nov. 25, 2010

Related U.S. Application Data

(63) Continuation of application No. PCT/JP2009/050164, filed on Jan. 5, 2009.

(30) Foreign Application Priority Data

Jan. 3, 2008  (GB) .................................. 0800083.8

(51) Int. Cl.
*H01L 31/00* (2006.01)
*H01L 31/107* (2006.01)

(52) U.S. Cl.
CPC .................................. *H01L 31/107* (2013.01)
USPC ....................... 250/214.1; 250/208.2; 257/431

(58) Field of Classification Search
CPC .................. H01L 29/66113; H01L 31/02027; H01L 31/107

USPC .................... 250/214.1, 214 R, 208.1, 208.2; 257/431

See application file for complete search history.

(56) References Cited

U.S. PATENT DOCUMENTS

| 4,967,066 | A | * | 10/1990 | Beraldin et al. ............... 250/205 |
| 5,892,575 | A | | 4/1999 | Marino |
| 6,218,657 | B1 | | 4/2001 | Bethune et al. |
| 2007/0085158 | A1 | * | 4/2007 | Itzler et al. ..................... 257/438 |
| 2007/0098402 | A1 | * | 5/2007 | Maeda et al. ................... 398/38 |
| 2007/0170353 | A1 | * | 7/2007 | Chou et al. ................. 250/214.1 |

FOREIGN PATENT DOCUMENTS

| EP | 1 132 725 A2 | 9/2001 |
| GB | 2 397 452 A | 7/2004 |
| JP | 4-315965 | 11/1992 |
| JP | 2003-243694 | 8/2003 |
| JP | 2004-509586 A | 3/2004 |
| JP | 2005-114712 A | 4/2005 |

(Continued)

OTHER PUBLICATIONS

H.B. Coldenstrodt-Ronge et al., "Avalanche photo-detection for high data rate applications", Journal of Physics B: Atomic, Molecular and Optical Physics, vol. 40, Sep. 25, 2007, XP002525955, pp. 3909-3921.

(Continued)

*Primary Examiner* — Francis M Legasse, Jr.
(74) *Attorney, Agent, or Firm* — Oblon, Spivak, McClelland, Maier & Neustadt, L.L.P.

(57) ABSTRACT

According to one embodiment, a photon detection system determines the number of detected photons. The detection system includes an avalanche photodiode and a measuring unit. The measuring unit measures an avalanche signal induced by illumination before the avalanche current through the device has saturated.

18 Claims, 10 Drawing Sheets

(56) References Cited

FOREIGN PATENT DOCUMENTS

| JP | 2006-66910 | 3/2006 | | |
|---|---|---|---|---|
| JP | 2006-066910 A | 3/2006 | | |
| JP | 2006-203050 A | 8/2006 | | |
| JP | 2010-520447 A | 6/2010 | | |
| WO | WO 2008/104799 A1 | 9/2008 | | |
| WO | WO 2008155679 A2 * | 12/2008 | ................ | G01T 1/17 |

OTHER PUBLICATIONS

Z.L. Yuan et al., "High speed single photon detection in the near infrared", Applied Physics Letters, vol. 91, No. 4, 2007, XP012100194, pp. 041114-1-041114-3.

N. Namekata et al., "800 MHz Single-photon detection at 1550-nm using an InGaAs/InP avalanche photodiode operated with a sine wave gating", Optics Express, vol. 14, No. 21, Oct. 16, 2006, XP002525954, pp. 10043-10049.

K. Tsujino et al., "A Charge-Integration Readout Circuit with a Linear-Mode Silicon Avalanche Photodiode for a Photon-Number Resolving Detector", Optics and Spectroscopy, vol. 103, No. 1, Jul. 2007, XP002525956, pp. 86-89.

Office Action issued Oct. 25, 2011, in Japanese Patent Application No. 2010-526100 with English translation.

Office Action issued Mar. 27, 2012 in Japanese Application No. 2010-526100 filed Jul. 29, 2010 (with English Translation).

S. Sasamori, et al., "500 MHz Operation of a Single-Photon Detector in the 1550nm Band," Japan: The Institute of Electronics, Information and Communicaiton Engineers, vol. J89-C, No. 12, pp. 1085-1096, Dec. 1, 2006.

A. Tomita, et al., "Balanced, Gated-Mode Photon Detector for Quantum-Bit Discrimination at 1550 nm," Optics Letters, vol. 27, No. 20, pp. 1827-1829, Oct. 15, 2002.

Office Action issued Aug. 6, 2013 in Japanese Patent Application No. 2011-162986 with English language translation.

Anna Stróztecka, et al., "Modification of the conductance of single fullerene molecules by endohedral doping", Applied Physics Letters, vol. 95, No. 13, Sep. 28, 2009, pp. 133118-1-133118-3.

* cited by examiner

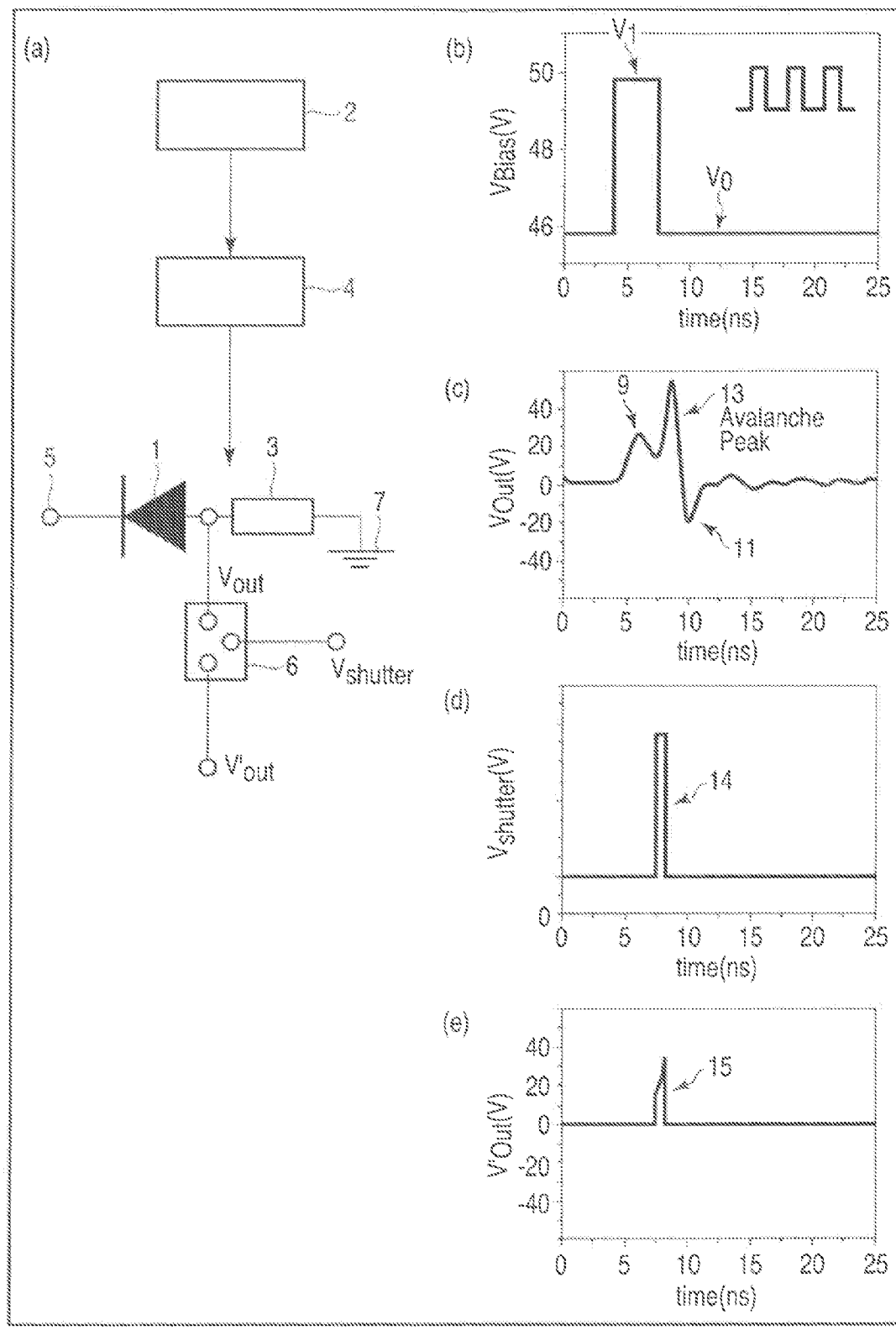
F I G. 12

PHOTON DETECTION SYSTEM AND METHOD OF PHOTON DETECTION FOR DETERMINING THE NUMBER OF PHOTONS RECEIVED AT A PHOTON DETECTOR

CROSS REFERENCE TO RELATED APPLICATIONS

This is a Continuation Application of PCT Application No. PCT/JP2009/050164, filed Jan. 5, 2009, which was published under PCT Article 21(2) in English.

This application is based upon and claims the benefit of priority from British Patent Application No. 0800083.8, filed Jan. 3, 2008; the entire contents of which are incorporated herein by reference.

FIELD

Embodiments described herein relate generally to the field of photon detectors and methods for detecting photons which are configured to measure a single photon, more specifically, the embodiments relate to the field of photon detectors and methods for detecting photons which can determine the exact number of photons received at a photon detector.

BACKGROUND

Detectors which are capable of detecting single photons so-called single photon detectors are an important component of any system which operates using the principles of quantum cryptography. Such systems rely upon the transmission of data bits as single particles, in this case, photons, which are indivisible. The data may be encoded using polarisation of the electric field vector of the photons, the phase of the photons etc.

However, as well as detecting a single photon, there is also a need to produce detectors which are capable of resolving the number of photons in a pulse of radiation. Such detectors are useful for characterising non-classical light sources such as single photon generators to determine if they are genuine and reliable single photon sources. Another potential application is for determining if one or more photons are received per pulse in a quantum communication system. If two or more photons are present in a pulse then the pulse may be subject to a pulse splitting attack where just one photon from the pulse is read by a eavesdropper. This seriously degrades the security of the system. Thus, it is desirable to develop a detector which allows the number of photons in a pulse to be accurately determined.

Single photon detection is also useful as a low level light detection means for spectroscopy, medical imaging or astronomy. Both in medical and astronomical applications the high energy photons (X-ray etc) or high energy particles are converted in scintillators into many (10-100) low energy photons. These low energy photons are then detected by avalanche photodiodes or photomultiplier tubes. As the low energy photons that are produced are scattered in space there is a need for large area detectors which are very sensitive. Also arrays of such detectors allow the spatial distribution of low energy photons to be obtained in order to gain information about the original photon. These applications would also benefit from the ability to count the number of photons incident on a single photon detector.

Previous attempts to develop a single photons detector which is capable of determining the number of photons detected from a pulse include single photon avalanche photodiodes (APDs) operated in the co-called "geiger mode". These detectors are binary ("click counting") detectors, several schemes have been proposed involving either multiple devices or time multiplexing to allow photon number counting. However such schemes cannot resolve two photons incident on the same detector at the same time.

BRIEF DESCRIPTION OF THE DRAWINGS

FIG. 1a is a schematic diagram of a prior art detection system using an avalanche photodiode (APD), FIG. 1b is a schematic plot of voltage against time for the input signal of the APD of FIG. 1a and FIG. 1c is a plot of the output signal as voltage against time for the detection system of FIG. 1a;

FIG. 3a is a plot of the input signal to the device of FIG. 3b, FIG. 3b is a schematic diagram of a detection system comprising an avalanche photodiode in accordance with an embodiment, FIG. 3c is a plot of a first part derived from the output signal of the APD of FIG. 3a, FIG. 3d is a plot of the second part derived from the output signal of the APD of FIG. 3a which has been delayed and FIG. 3e is a plot of the self-differenced output signal produced by the device of FIG. 3b;

FIG. 8a is a schematic diagram of a further variation on the detection system of FIG. 3b and FIG. 8b is a plot of the input signal to the detection system of FIG. 8a;

FIG. 12 shows a detection system in accordance with a further embodiment. FIG. 12a is a schematic diagram of a detection system in accordance with a further embodiment, FIG. 12b is a schematic plot of voltage against time for the input signal of the APD of FIG. 12a, FIG. 12c is a plot of the raw output signal voltage against time for the detection system of FIG. 12a, FIG. 12d is a plot of the profile applied by the shutter of FIG. 12a and FIG. 12e shows the output which has been modified by the shutter of FIG. 12a.

DETAILED DESCRIPTION

Figure 1:
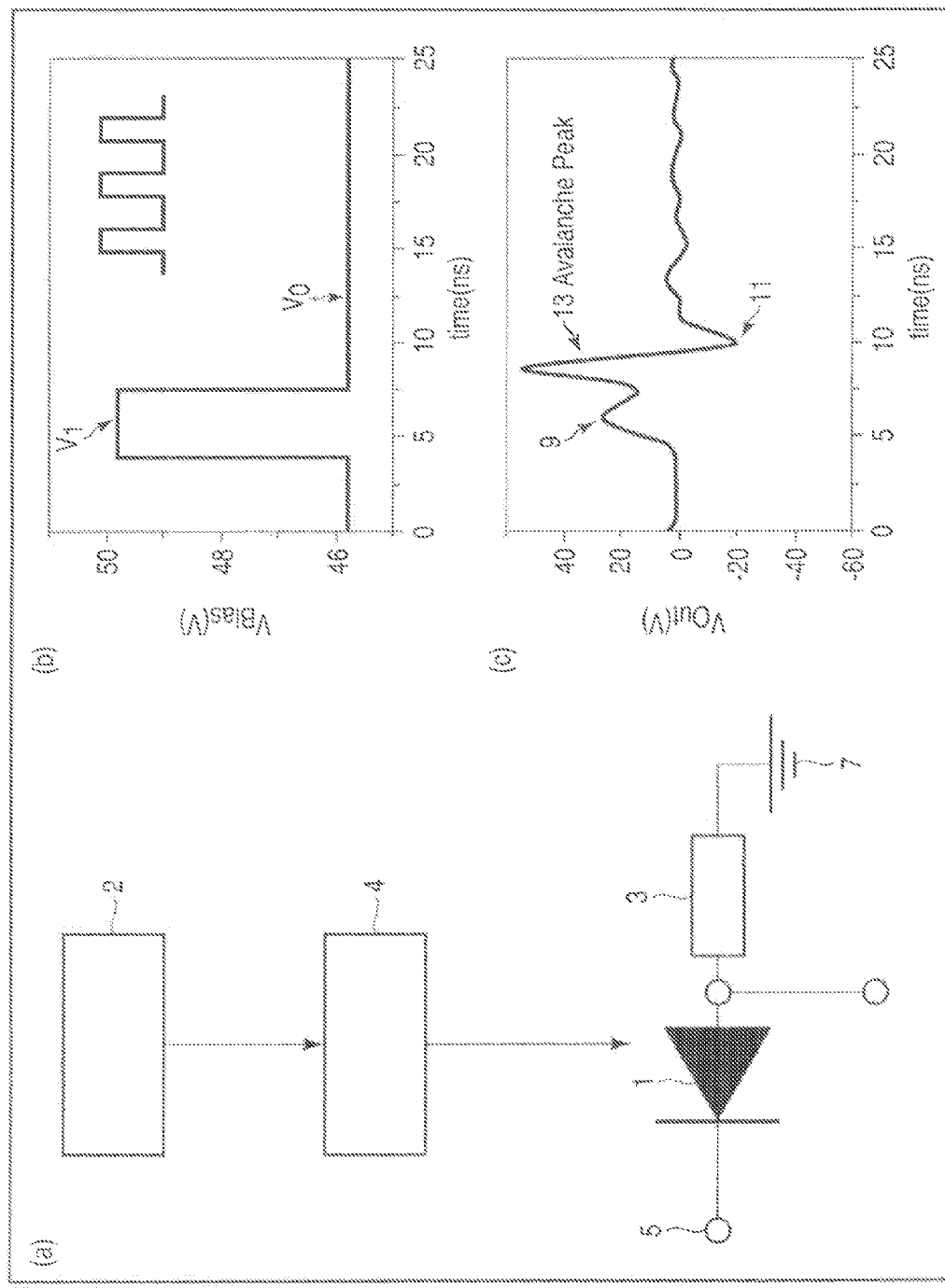
FIG. 1 shows a prior art detection system using an avalanche photodiode (APD).

In general, according to one embodiment, a photon detection system determines the number of detected photons. The detection system includes an avalanche photodiode and a measuring unit. The measuring unit measures an avalanche signal induced by illumination before the avalanche current through the device has saturated.

The systems which are self differenced or where a compensating signal is applied can generally be operated with shorter gate durations and higher frequency than conventional systems. Thus, these systems are particularly advantageous for extracting an avalanche signal which has not saturated.

A periodic gating signal may be applied to the avalanche photodiode. The gating signal may be a rectangular wave signal or a sinusoidal signal. To prevent the avalanche saturating the gate duration is typically less than 1 ns, more preferably 0.8 ns or less, even more preferably 0.5 ns or less, e.g. 0.4 ns. The maximum possible gate duration is in general shorter for higher applied excess bias.

Preferably, the gating signal has a frequency in excess of 1 MHz, more preferably in excess of 50 MHz, even more preferably in excess of 100 MHz.

The above discussion has measured the avalanche signal before saturation by applying a gating bias which is short enough to prevent avalanche saturating. However, it is also possible to operate the system to produce an avalanche which saturates, but where the avalanche signal is measured for a time less than the time which the avalanche takes to saturate. This could be achieved by using a circuit which captures the early avalanche signal and blocks the signal as the avalanche saturates.

Regardless of how the system is configured, the size of the avalanche signal may be measured in terms of current or charge.

FIG. 1a is a schematic of a known detection system which may be used to detect single photons. It comprises an avalanche photodiode 1 and a resistor 3. In this example, the resistor is a 50Ω resistor, but other resistances can be used. The avalanche photodiode (APD) 1 is configured in reverse bias. An input signal which acts as a gating signal is shown in FIG. 1b is applied between input 5 and ground 7.

The input voltage shown in FIG. 1b is a periodic series of rectangular voltage pulses, which varies between a first value $V_1$ and a second value $V_0$. $V_1$ is selected to be above the breakdown voltage of the avalanche photodiode 1. When such a voltage is applied to the avalanche photodiode, the detector becomes sensitive to incoming photons which have been generated by a weak light source, typically made of a pulsed laser 2 and an attenuator 4 in detector characterisation setup.

An absorbed photon generates an electron-hole pair in the APD, which are separated and accelerated by the electric field inside the APD. Due to the electric field within the avalanche region of the APD, the electron or hole may trigger an avalanche of excess carriers causing a macroscopic and detectable current flow through the APD.

The macroscopic current is usually detected by monitoring the voltage drop across a resistor 3 as shown in FIG. 1c. A voltage spike 13 indicates that a photon has been detected. However, as the APD has a finite capacitance, typically one pico-Farad, the output also contains a charging pulse 9 due to the charging of the APD capacitance when reacting to the rise edge of the gating pulse, followed by a discharging dip 11 due to the discharging of the APD capacitance when reacting to the falling bias at the falling edge of a gate pulse. The charging pulse is positive, and often obscures a photon induced avalanche. Thus, the APD bias voltage is often increased so that the amplitude of the avalanche spike 13 exceeds that of the charging pulse 9. An avalanche can then be detected by setting discrimination level above that of all charging pulses.

In a conventional APD, the diode is biased above its breakdown voltage for a time which allows the avalanche current to saturate. Hence, the avalanche signal size is determined by the external circuit. Thus, it is impossible to discriminate photon numbers in a pulse because there is no difference in the avalanche signals caused by one or more photons. A system operated in this way cannot be used to determine the number of photons within a pulse, as evidenced by the results of FIG. 2.

Figure 2:
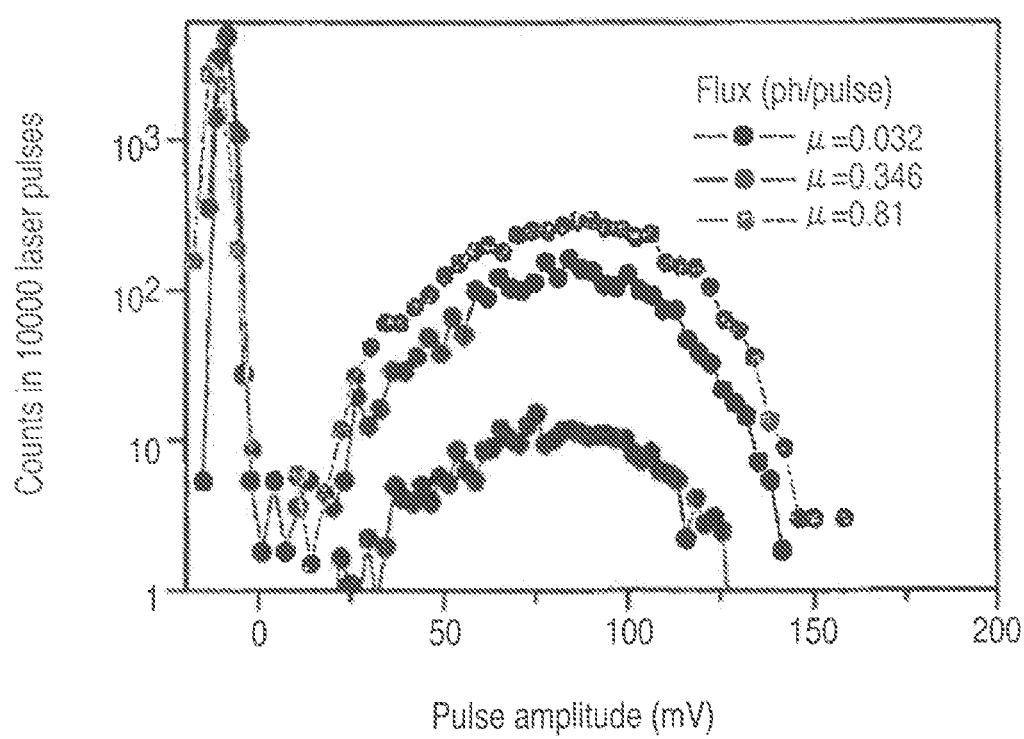
FIG. 2 shows the statistics of the amplitude of the output of the photon detection system of FIG. 1a for different fluxes.

FIG. 2 shows statistics of how the amplitude of the avalanche peak (peak 13 of FIG. 1) for the system of FIG. 1a. In this measurement, the APD was illuminated by a pulsed laser diode at 1550 nm which was attenuated to the desired photon flux. The APD was gated using a 3.5 ns rectangular voltage pulse with an amplitude of 4V and an excess voltage of 2.5V that is above the APD breakdown. The laser pulse and the APD gate were synchronised to produce the maximum detection efficiency, and the clock rate was 100 kHz. The amplitude of the APD response was recorded using an oscilloscope, and a histogram of the amplitudes was built up after a sufficient number of measurements, as shown in FIG. 2, where the x-axis is the height of the APD reponse signal peak in mV at expected avalanche location (see FIG. 1c) and the y-axis represents the number of occurrences of a peak of that height per 10000 laser pulses.

The upper trace corresponds to a flux of 0.81 photon per pulse received at the APD. The middle trace corresponds to a flux of 0.346 photons per pulse and the lower trace to a flux of 0.032 photons per pulse.

For a photon number resolving detector, the detector signal output is proportional to the number of photons detected. Due to the quantised nature of photons, discrete distributions according to photon number (i.e. 1, 2, 3) is expected in the recorded signal amplitude histograms of FIG. 2. Further, the weight for each photon number is expected to vary according to the photon flux which obeys Poissonian distribution if the detector could resolve photon numbers. However, this is not the case in FIG. 2.

It can be seen that for all three fluxes, the central peak height, i.e. the most common peak height is approximately 80 mV. In the largest detected flux of 0.81, a large number of the pulses would be expected to contain 2 or more photons whereas this would not be the case where the detected flux was a low as 0.032. However, since both fluxes show the same central peak height, the APD system of FIG. 1 could be not be used to distinguish between a pulse which has one photon and a pulse which contains two photons.

The large peak centred at −9 mV corresponds to the signal output when no photons were detected in the pulses.

FIG. 3b illustrates a circuit in accordance with an embodiment.

An input signal 3a of the type described with reference to FIG. 1b may be applied. However, the input signal needs to be large enough to bias the device above its breakdown voltage. In this particular example, the bias is set so that the avalanche peak is smaller than the charging peak.

The bias applied as shown in FIG. 3a is applied such that after illumination, the APD is biased above its breakdown for a time which is shorter than the time required for the avalanche current to saturate, which is typically over 1 ns depending on the bias applied. This results in a peak which has a height related to the number of photons which have caused the avalanche.

It is proposed that an avalanche which is induced by a single photon first forms as a localised microscopic filament which is spatially confined within the APD in the region where the photon is absorbed. If the bias across the APD is maintained then the filament eventually spreads until there is a current flowing through the whole of the device and the current saturates.

Thus, by limiting the time when the device is reverse biased, it is possible to measure a signal which is related to the number of photons which have caused the avalanche.

However, as explained previously, APDs are often operated at low frequencies. The circuit of FIG. 3b shows an APD which can be operated at a higher frequency and thus one where it is possible to reverse bias the device for a very short time.

As before, the device comprises an avalanche photodiode provided in series with a resistor 53. The voltage dropped across the resistor 53 is first input to power splitter 55. Power splitter 55 divides the output signal into a first part as shown in FIG. 3c and a second part which is identical to the first part shown in FIG. 3c. These two signals are then output via ports 57 and 59 of power splitter 55. The signal which is output via port 59 enters a delay line 56 which serves to delay the signal by a duration equal to the gating period. The delayed signal is shown in FIG. 3d. The first part of the signal and the delayed second part are then fed into hybrid junction 61. Hybrid junction 61 combines the first and the delayed second parts of the signals with 180° phase shift to give the output shown in FIG. 3e.

As can be seen in FIG. 3c, a photon-induced avalanche by APD 51 produces a voltage spike signal 73. FIG. 3d is an identical copy of FIG. 3c except that the signal is delayed by one clock period. By numerically subtracting 3c off 3d, a peak 77 and a dip 75 are seen in the trace of FIG. 3e which indicates the presence of a photon. The provision of a positive peak followed by a negative dip (or a negative dip followed by a positive peak dependent on the configuration of the equipment) allows a clear signature indicating the detection of a photon.

The circuit in FIG. 3b performs the above described numerical self-differencing in hardware using a self-differencing circuit.

The output of the self-differencing circuit is then fed into peak measuring means 63 which determines the size of the peak due to the avalanche. The number of photons may be determined by determining the peak height which is related to the avalanche current or by determining the area under the peak to give the avalanche charge.

The power splitter 55 may be of the type which is sold under part number ZFRSC-42+ from Mini-circuits and the hybrid junction is also available under part number ZFSCJ-2-4 which is also available from Mini-circuits. The exact delay can be realised by using two co-axial cables with two different lengths that link the power splitter and the hybrid junction. It should be noted that the combination of the power splitter 55, the delay line 56 and the hybrid junction 61 may be integrated onto a single printed circuit board.

Typically, the gate frequency could be 1.25 GHz and the gate width 0.4 ns. The lower voltage level might be 4.6V below breakdown and the higher level 2V above the breakdown voltage. The breakdown voltage might typically be 47V for an InGaAs APD.

Figure 3:
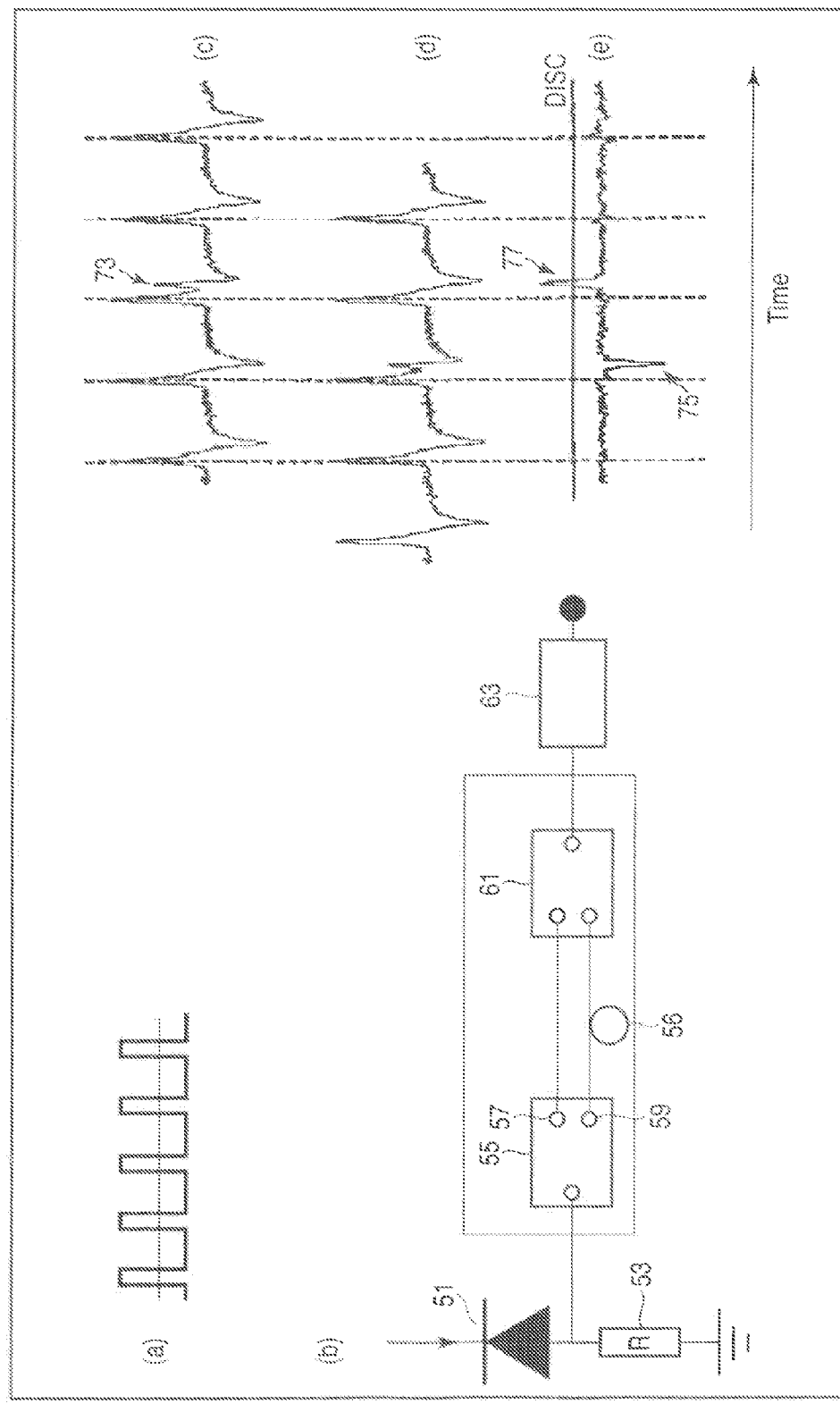
FIG. 3 shows a detection system comprising an avalanche photodiode in accordance with an embodiment.
Figure 4:
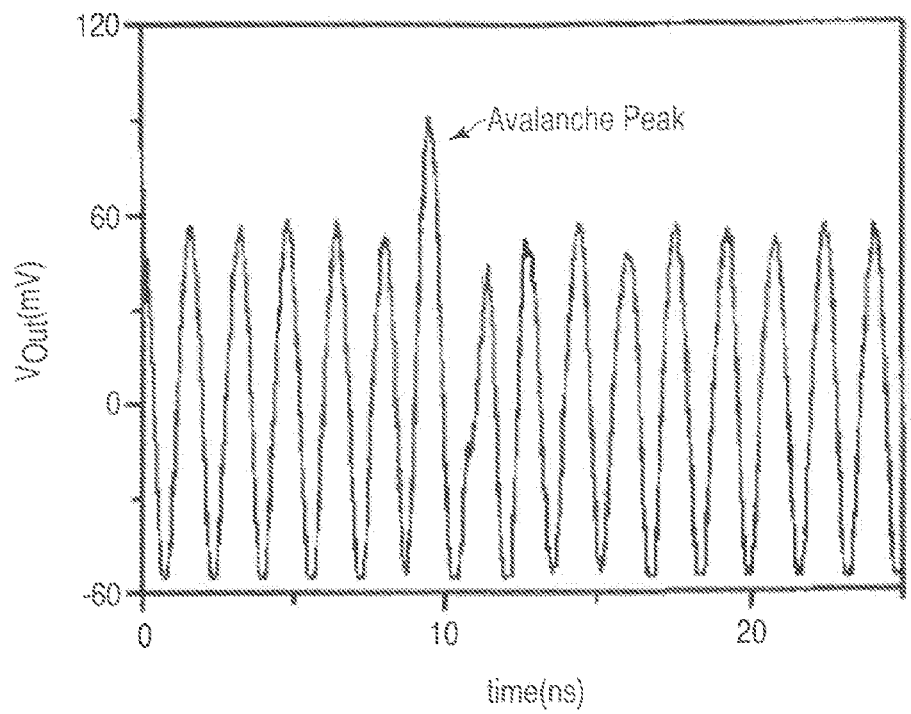
FIG. 4 is a plot of the actual output of the system of FIG. 3 at an APD gating frequency of 0.62 GHz.

FIG. 4 shows actual data of a self differenced output with a peak due to an avalanche. At high frequencies, there is often an oscillation at the frequency of the gate bias (not shown in FIG. 3e) which results in the self differencing not being completely cancelled. Thus the data of FIG. 4 shows this oscillation in addition to the avalanche signal. It can be seen from the data that the avalanche peak can be easily identified.

Figure 5:
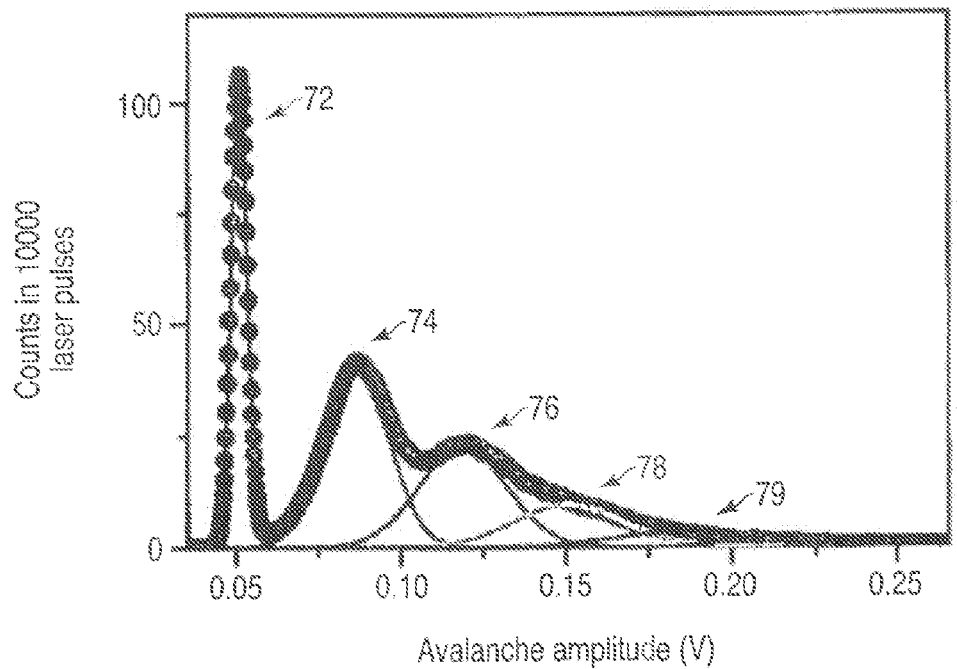
FIG. 5 shows the statistics of the amplitude of the output of the photon detection system of FIG. 3b.

FIG. 5 shows statistics of the amplitude of the peak for the system of FIG. 3b. The x-axis is the height of the measured peak in voltage and the y-axis represents the number of occurrences of a peak of that height per 10000 laser pulses. In this measurement, the APD was illuminated by an attenuated laser whose intensity was set so as to produce on average 1.54 photons was detected per pulse.

The solid lines show theoretical modelling using Poissonian photon number distribution of an attenuated laser source and the dots represent actual data. At the flux of 1.54 used, there is a significant proportion of pulses during which no photons was detected, producing a zero-photon peak 72 at approximately 0.05V in FIG. 5. The amplitude of the zero-photon peak 72 is not exactly zero because of the imperfect self-differencing circuit used. In practice, it is difficult to develop a self-differencing circuit which cancels perfectly. Thus, there will always be a small residual signal in the absence of photons. It can be seen that the avalanche amplitude of the zero photon peak of FIG. 5 is consistent with the oscillatory structure of FIG. 4.

Peak 74 which is formed around 0.09V is due to an avalanche formed by one photon, peak 76 at approx 0.13V due to an avalanche formed by detection of 2 photons, peak 78 at 0.16V due to an avalanche formed by detection of 3 photons and peak 79 at 0.19V due to an avalanche formed by detection of 4 photons. Thus, unlike the data of FIG. 2, the system can be used to distinguish between peaks formed by avalanches due to different numbers of photons.

Figure 6:
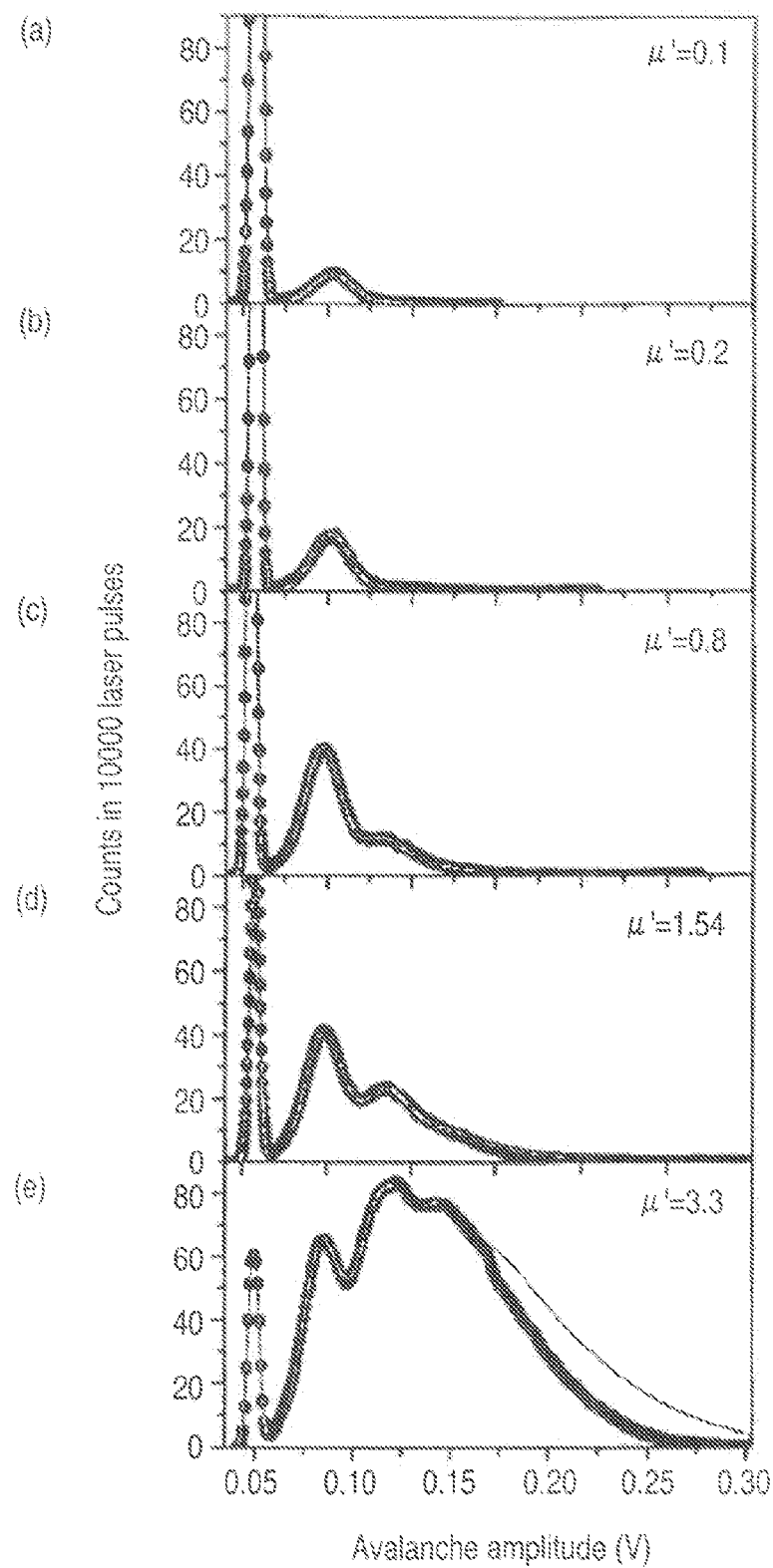
FIG. 6 shows the statistics both measured and modelled of the amplitude of the output of the photon detection system of FIG. 3b for five different fluxes.

FIG. 6 shows statistics of the amplitude of the peak for the system of FIG. 3b for different fluxes.

In FIG. 6a, a beam with a flux ($\mu$) of 0.1 is used to illuminate the APD of FIG. 3b. A strong peak at 0.051V is seen due to noise which is marked as the "zero photon" peak. A further peak is also observed in some of the measurements centred at 0.087V due to the detection of 1 photon within the pulse. No further peaks are seen.

The data for a flux of 0.2 is shown in FIG. 6b. Again a large peak corresponding to 0 photons is seen a 0.051V and a peak at approx 0.087V is seen corresponding to the detection of a single photon. However, the single photon peak in FIG. 6b is larger than that in FIG. 6a as approximately twice as many pulses will contain a single photon since the flux of FIG. 6b is twice the flux of FIG. 6a.

The data for a flux of 0.8 is shown in FIG. 6c. Again a large peak corresponding to 0 photons is seen a 0.051V and a peak at approx 0.087V is seen corresponding to the detection of a single photon. The single photon peak is larger in FIG. 6c than that of FIG. 6b which is to be expected as more pulses contain photons in the data of FIG. 6c.

However, in FIG. 6c, a new peak is seen in a small number of measurements centred as 0.12V. This indicates that for some of the measurements a peak amplitude which indicates that two photons have been detected is seen.

The data for a flux of 1.54 is shown in FIG. 6d. Again a large peak corresponding to 0 photons is seen a 0.051V and a peak at approx 0.087V is seen corresponding to the detection of a single photon. The peak at 0.12V corresponding to two photon detection is more pronounced in this data as more pulses will contain two photons due to the higher flux.

Finally, the data for a very high flux of 3.3. is shown in FIG. 6e. Again a large peak corresponding to 0 photons is seen a 0.051V and a peak at approx 0.087V is seen corresponding to the detection of a single photon. The peak at 0.12V corresponding to two photon detection is now larger than the peak for 0 photons and one photon. Further, a new peak is seen to form at 0.151V corresponding to detection of pulses with 3 photons.

FIG. 3b exemplified one possible self differencing circuit for an APD.

Figure 7:
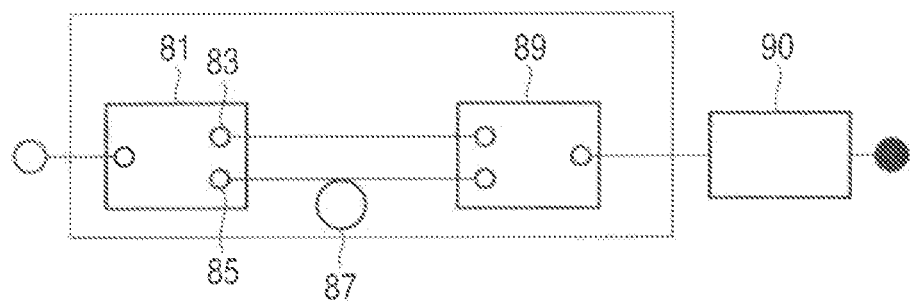
FIG. 7 is a variation on the device of FIG. 3b.

FIG. 7 shows a variation on the device described with reference to FIG. 3b. The device of FIG. 7 takes the output from an APD and resistor (not shown) and provides it to hybrid junction 81. Hybrid junction 81 splits the output into a first part and a second part is described with reference to the power splitter 55 of FIG. 3b. However, hybrid junction 81 also introduces a 180° phase shift between the first part and the second part of the signal. The first part of the signal is output via output 83 and the second part is sent via output 85 into delay line 87.

The systems of FIG. 3b and FIG. 7 have both used combinations of power splitters/combiners and hybrid junctions. However, the hybrid junction may be replaced by a combination of phase shifters and power combiners. For example, a power combiner and a 180° phase shifter.

In a further variation on the systems of FIG. 3b, a tuneable RF attenuator is provided which may be used in either of the inputs to hybrid junction 61 (FIG. 3b) or power combiner 89 (FIG. 7) to ensure that the two signals reach the hybrid junction or power combiner with equal amplitudes.

Typically, all the hybrid junctions and power splitter/combiners have finite response frequency range. For example, hybrid junction, Mini-circuits ZFSCJ-2-4 has a frequency range of 50 MHz to 1 GHz. It may not work well when signal contains frequency components outside of the range, and the cancellation may not be perfect. To improve signal to background ratio, further bandpass filters may be used to filter out those frequency components. In FIG. 3b, for example, a low bandpass filter may be placed after the hybrid junction output.

The output of the power combiner 89 is fed into measuring means 90 which is configured to determine the amplitude of the output of the power combiner in order to determine the number of photons which gave rise to the avalanche.

Figure 8:
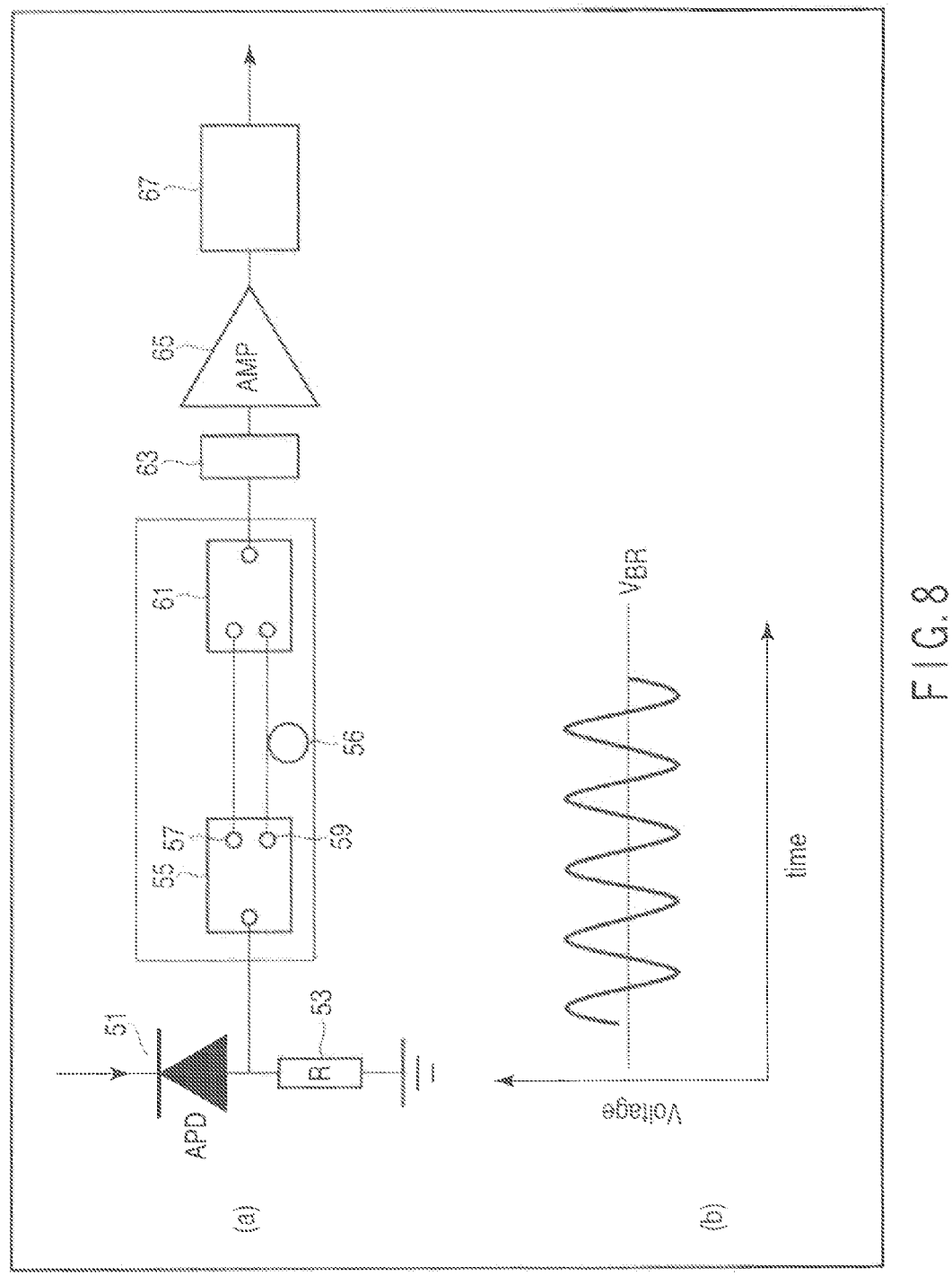
FIG. 8 shows a further variation on the detection system of FIG. 3.

FIG. 8 shows a further variation on the system described with reference to FIGS. 3 and 7.

The system of FIG. 8a has an avalanche photodiode 51 and a resistor 53 as described with reference to FIG. 3b. Further, the signal of the voltage dropped across the resistor 53 is taken to power splitter 55 which splits the signal into a first part and a second part. The first part being outputted via output 57 and the second part via output 59 into delay line 56. The first part of the signal and the delayed second part are then fed into hybrid junction 61 which combines the two parts of the signal with 180° phase difference.

However, in the apparatus of FIG. 8a, the input voltage signal is a sinusoidal voltage signal as shown in FIG. 8b and not the periodic train of rectangular pulses as shown in FIG. 3a. It is possible to bias the detection system of FIG. 8a with a sinusoidal signal as long as the signal has sufficient voltage swing to bias the APD above and below the threshold for avalanche breakdown. In fact, the detector may be biased with any periodic voltage signal.

In response to the sinusoidal gating voltages, the APD output is also sinusoidal. Superimposed on the sinusoidal output are occasional avalanche spikes due to photon detection. The amplitude of avalanche spikes is typically much smaller than that of the sinusoidal output. However, as described previously with reference to FIG. 3b, by using a power splitter, delay line, and hybrid junction, the sinusoidal components can be largely cancelled and the avalanche spikes become clearly visible.

Furthermore, any small remaining components of the sinusoidal signal may be removed from the output of the hybrid junction 61 by a band rejection filter 63 which is tuned to the frequency of the sinusoidal signal. The signal is passed to amplifier 65 and then into measuring means 67 in order to determine the amplitude of photon induced spikes in the outputted signal.

Figure 9:
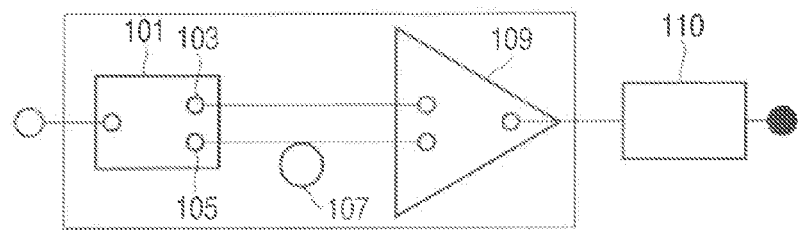
FIG. 9 is a schematic diagram of a detection system which is a variation of the detection system of FIG. 3b.

FIG. 9 shows a further variation in the system of FIG. 3, the configuration is the same as that described with reference to FIG. 3. The output signal is then fed into power splitter 101. Power splitter 101 divides the signal into a first part and a second part. The first part is output via output 103 and the second part via output 105 which is further fed into delay line 107. The two parts of the signal are then fed into differential amplifier 109. Due to the configuration of amplifier 109, only the difference of the two inputs is amplified. The differenced signal is them passed to measuring means 110 which measures the amplitude of the signal to determine the number of photons which have given rise to the avalanche.

FIGS. 3 to 9 have used a self differencing arrangement in order to derive photon number information from an APD. However, it is also possible to use other technique to drive an APD in such a way that the size of the output signal is correlated with the number of photons which caused an avalanche.

Figure 10:
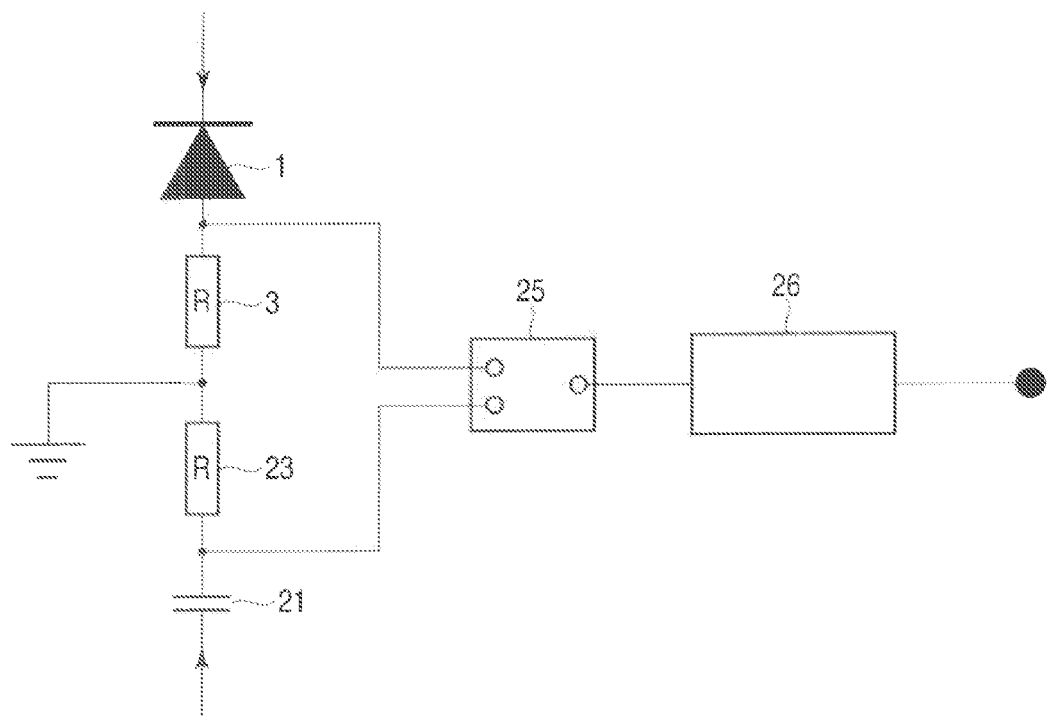
FIG. 10 is a detection system incorporating an avalanche photodiode and a capacitor.

One attempt at doing this is shown in FIG. 10. To avoid unnecessary repetition, like reference numerals will be used to denote like features with those of FIG. 1. FIG. 10 again has an avalanche photodiode 1 and resistor 3. A capacitor 21 and further resistor 23 are formed in series with the avalanche photodiode 1 and resistor 3 such that resistors 3 and 23 are connected back to back.

From this circuit, the combined DC and pulsed bias for the APD varying between $V_0$ and $V_1$ is applied to the APD, while just the pulse signal (varying between $V_1$ and $V_0$) is applied to the capacitor. The output signal from the capacitor 21 will be similar to the output signal from APD 1 in the absence of absorption of a photon. The output from the APD 1 and capacitor 21 are then combined in hybrid junction 25. Hybrid junction 25 will reverse the phase of one of its two inputs. Therefore, the hybrid junction 25 combines the output signals from both the APD 1 and the capacitor 21 with a 180° phase difference so that they nearly cancel. This allows the charging 9 and discharging 11 peaks to be partially cancelled.

The output of the hybrid junction 25 is fed into measuring means 26 which measures the height of peaks in the output to determine the number of photons which caused the avalanche signal.

Figure 11:
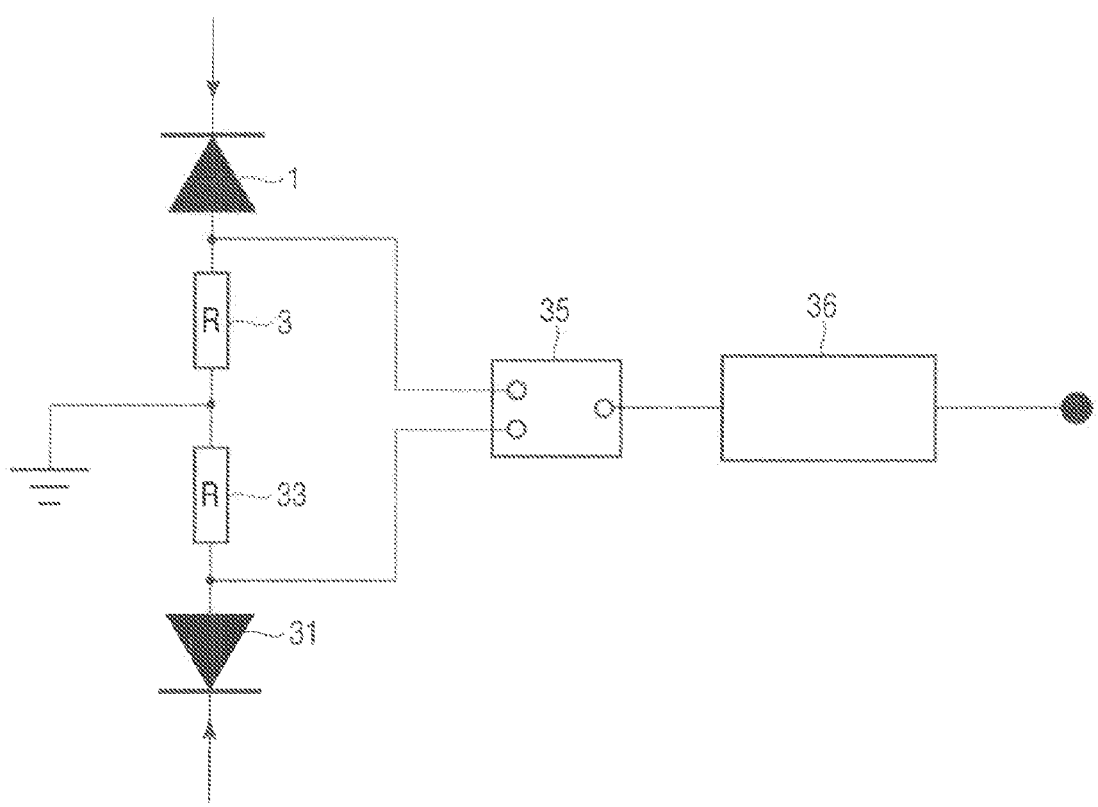
FIG. 11 is a schematic diagram of a detection system comprising two APDs arranged to cancel one another.

FIG. 11 illustrates a further improvement to the system of FIG. 10 where capacitor 21 is now replaced with a second APD 23.

To avoid unnecessary repetition, like reference numerals will be used to denote like features.

A second resistor 31 and a second APD 33 are provided in the same positions as second resistor 23 and capacitor 21 of FIG. 10. The output of the first APD 1 and second APD 33 are then combined at hybrid junction 35 with 180° phase difference in order for the components to cancel one another. The output of the hybrid junction is then fed into measuring means 37 which in turn which measures the height of peaks in the output to determine the number of photons which caused the avalanche signal.

FIG. 12 is a schematic of a yet further embodiment. In FIG. 12, a bias above the breakdown voltage is applied for a time which allows the avalanche to saturate. However, the signal is blocked so that measurement of the avalanche signal is only performed over a very short time.

The system of FIG. 12a is similar to that of FIG. 1. Therefore, to avoid any unnecessary repetition, like reference numerals will be used to denote like features.

As in FIG. 1, the input voltage is shown in FIG. 12b and when the voltage is raised to a value of $V_1$ which is above that of the breakdown voltage, the detector becomes sensitive to incoming photons. The signal $V_{out}$ is shown in FIG. 12c. This is the same as that shown in FIG. 1c where the avalanche signal saturates and is thus determined by the external circuit. However, this output signal $V_{out}$ is fed into shutter circuit 6. Shutter circuit 6 blocks out the part of the avalanche signal where the avalanche signal saturates by using a profile 14. The output of shutter circuit 6 is $V'_{out}$ which is shown in FIG. 12e and is a single isolated pulse 15. As this pulse has been derived before the avalanche signal saturates, measurement of the height of this pulse indicates the number of photons received.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photon detection system configured to determine a number of detected photons in excess of a single photon in a single light pulse, the detection system comprising an avalanche photodiode and a measuring unit configured to measure an avalanche signal induced by illumination by the single light pulse before an avalanche current through the avalanche photodiode has saturated, the avalanche signal being output from the avalanche photodiode, the avalanche signal being measured for a time less than the time which an avalanche takes to saturate, the number of detected photons in excess of the single photon in the single light pulse being determined based on an amplitude of a peak formed by the avalanche signal; wherein the measuring unit comprises an applying unit configured to apply a bias larger than the breakdown voltage of said photodiode across said photodiode for a time duration, said time duration being shorter than the time required for the avalanche current through the avalanche photodiode to saturate after illumination of the avalanche photodiode and a measuring unit configured to measure the size of the avalanche signal.

2. A system according to claim 1, further comprising an isolating unit configured to isolate a first part and a second part from the signal due to the avalanche.

3. A system according to claim 1, further comprising an applying unit configured to apply a gating signal to said avalanche photodiode.

4. A system according to claim 1, wherein the measuring unit is configured to apply bias above the breakdown for a time which allows said avalanche to saturate and said avalanche signal is measured for a time less than the time which the avalanche takes to saturate.

5. A system according to claim 1, wherein the avalanche charge or avalanche current is measured to determine the number of photons.

6. A system according to claim 2, wherein the isolating unit comprises an applying unit configured to apply signal which compensates for the response of said photodiode in the absence of illumination.

7. A system according to claim 2, wherein the isolating unit comprises a signal divider to divide the output signal of the photodiode into the first part and the second part, where the first part is substantially identical to the second part, a delaying unit configured to delay the second part with respect to the first part and a combiner for combining the first and delayed second parts of the signal such that the delayed second part is used to cancel periodic variations in the first part of the output signal.

8. A system according to claim 3, wherein the gating signal is a rectangular gating signal.

9. A system according to claim 3, wherein the gating signal has a frequency in excess of 50 MHz.

10. A system according to claim 7, wherein the delaying unit is configured to delay the second part of the signal by an integer multiple of said period.

11. A system according to claim 7, further comprising a balancing unit configured to balance the amplitudes of the two signals arriving at the combiner.

12. A system according to claim 7, further comprising an inverting unit configured to invert one part of the signal with respect to the other part of the signal.

13. A system according to claim 4, further comprising an operating unit configured to operate on the signal measured from the APD and block the part of the signal where the avalanche current has saturated.

14. A circuit for determining a number of photons in excess of a single photon in a single light pulse detected by an avalanche photodiode, the circuit comprising a measuring unit configured to measure an avalanche signal induced by illumination by the single light pulse before an avalanche current through the avalanche photodiode has saturated, the avalanche signal being output from the avalanche photodiode, the avalanche signal being measured for a time less than the time which an avalanche takes to saturate, the number of detected photons in excess of the single photon in the single light pulse being determined based on an amplitude of a peak formed by the avalanche signal; wherein the measuring unit comprises an applying unit configured to apply a bias larger than the breakdown voltage of said photodiode across said photodiode for a time duration, said time duration being shorter than the time required for the avalanche current through the avalanche photodiode to saturate after illumination of the avalanche photodiode and a measuring unit configured to measure the size of the avalanche signal.

15. A method for determining a number of photons in excess of a single photon in a single light pulse detected by an avalanche photodiode comprising measuring an avalanche signal induced by illumination by the single light pulse in the avalanche photodiode before an avalanche current through the avalanche photodiode has saturated, the avalanche signal being output from the avalanche photodiode, the avalanche signal being measured for a time less than the time which an avalanche takes to saturate, the number of detected photons in excess of the single photon in the single light pulse being determined based on an amplitude of a peak formed by the avalanche signal; applying a bias above the breakdown voltage of said photodiode across said photodiode for a time duration, said time duration being shorter than the time required for the avalanche current through the avalanche photodiode to saturate after illumination of the avalanche photodiode and measuring the size of the avalanche signal.

16. A method according to claim 15, comprising applying a bias above the breakdown voltage of said photodiode across said photodiode for a time which allows said avalanche to saturate and measuring said avalanche signal for a time less than the time which the avalanche takes to saturate.

17. A method according to claim 15, wherein the source of illumination is synchronised such that the avalanche signal is measured when photons arrive at the avalanche photodiode.

18. A method according to claim 15, wherein the size of the avalanche signal is compared with one of more predetermined levels to determine the number of photons which have been detected.

* * * * *